United States Patent [19]

Schertz et al.

[11] 4,404,527
[45] Sep. 13, 1983

[54] BRIDGE AUDIO AMPLIFIER INCLUDING LOW LEVEL FADE CONTROL

[75] Inventors: Burtron D. Schertz; Jerry L. Glandon, both of Kokomo, Ind.

[73] Assignee: General Motors Corporation, Detroit, Mich.

[21] Appl. No.: 203,425

[22] Filed: Nov. 3, 1980

[51] Int. Cl.³ .............................................. H03F 3/68
[52] U.S. Cl. .................................. 330/84; 179/1 GQ; 179/1 VL; 330/146; 330/254; 330/295
[58] Field of Search ................ 330/84, 146, 254, 262, 330/271, 275, 295; 179/1 GQ, 1 VL; 358/27

[56] References Cited

U.S. PATENT DOCUMENTS

| | | | |
|---|---|---|---|
| 3,702,901 | 11/1972 | Cherry | 179/1 G |
| 3,769,459 | 10/1973 | Niffenegger et al. | 179/1 VL |
| 3,808,545 | 4/1974 | Stanley | 330/265 |
| 3,849,601 | 11/1974 | Goncharoff | 179/1 D |
| 3,870,964 | 3/1975 | Mills | 330/284 |
| 3,875,334 | 4/1975 | Hilbert et al. | 179/1 D |
| 3,990,020 | 11/1976 | Porter | 330/146 |
| 4,053,996 | 10/1977 | Schertz et al. | 361/98 |
| 4,076,959 | 2/1978 | Gilbert et al. | 179/1 D |
| 4,109,214 | 8/1978 | Main | 330/254 |

Primary Examiner—James B. Mullins
Attorney, Agent, or Firm—Albert F. Duke

[57] ABSTRACT

A bridge audio amplifier is disclosed which includes an input stage for receiving an audio input signal and having a bias amplifier and a signal amplifier which provide a combined output current containing a substantially constant dc component and an ac component which is dependent on the input signal and the relative transconductance of the bias and signal amplifiers. The transconductance of the bias and signal amplifiers is reciprocably varied by a dc control voltage to vary the ac component of the current. The output current is converted to a voltage signal and applied to an output stage for driving a speaker. Two such audio amplifiers driving front and rear speakers may be employed to achieve a low level fade function.

6 Claims, 4 Drawing Figures

BRIDGE AUDIO AMPLIFIER INCLUDING LOW LEVEL FADE CONTROL

FIELD OF THE INVENTION

This invention relates to audio amplifiers and, more particularly, to a bridge audio amplifier including a low level fade control.

BACKGROUND OF THE INVENTION

The fade control provided on certain radio receivers selectively permits the output of the front speakers, for example, to be reduced without effecting the output of the rear speakers. Usually the fade function is implemented by a rather complicated high power dual fader control at the output of the audio amplifier. This is an expensive approach which also results in problems of power loss, hop-off resistance effects and sharp power rise contour over a small portion of the range of rotation of the fader.

SUMMARY OF THE INVENTION

It is an object of the present invention to provide an audio amplifier including a low level fade control particularly adapted for implementation in integrated circuit form.

It is another object of the present invention to provide an audio amplifier including a bridge connected output stage for driving a load and an input stage comprising a pair of transconductance amplifiers and means for reciprocably varying the transconductance of the input amplifiers as a function of a dc control voltage to thereby vary the gain of the audio amplifier.

It is another object of the present invention to provide a pair of bridge audio amplifiers for driving front and rear speakers respectively and which include input stages comprising a pair of transconductance amplifiers whose transconductance is reciprocably varied to achieve a low level fade function.

In accordance with the present invention the output stage of an audio amplifier includes a master and slave section interconnected in a bridge configuration to obtain maximum voltage swing across a speaker from a given supply voltage. The input stage of the amplifier includes a bias transconductance amplifier and signal transconductance amplifier providing a combined current output to a current-to-voltage conversion stage connected with the output stage. The outputs of the audio amplifier are connected through a different feedback network to one input of each of the transconductance amplifiers while the audio input signal is applied to the other input of the signal transconductance amplifier. The fade feature is implemented by reciprocably varying the transconductance of the two transconductance amplifiers as a function of a dc control voltage to effectively reduce the gain of the audio amplifier.

A more complete understanding of the present invention may be had from the following detailed description which should be read in conjunction with the drawings in which:

DESCRIPTION OF THE PREFERRED EMBODIMENT

Figure 1:
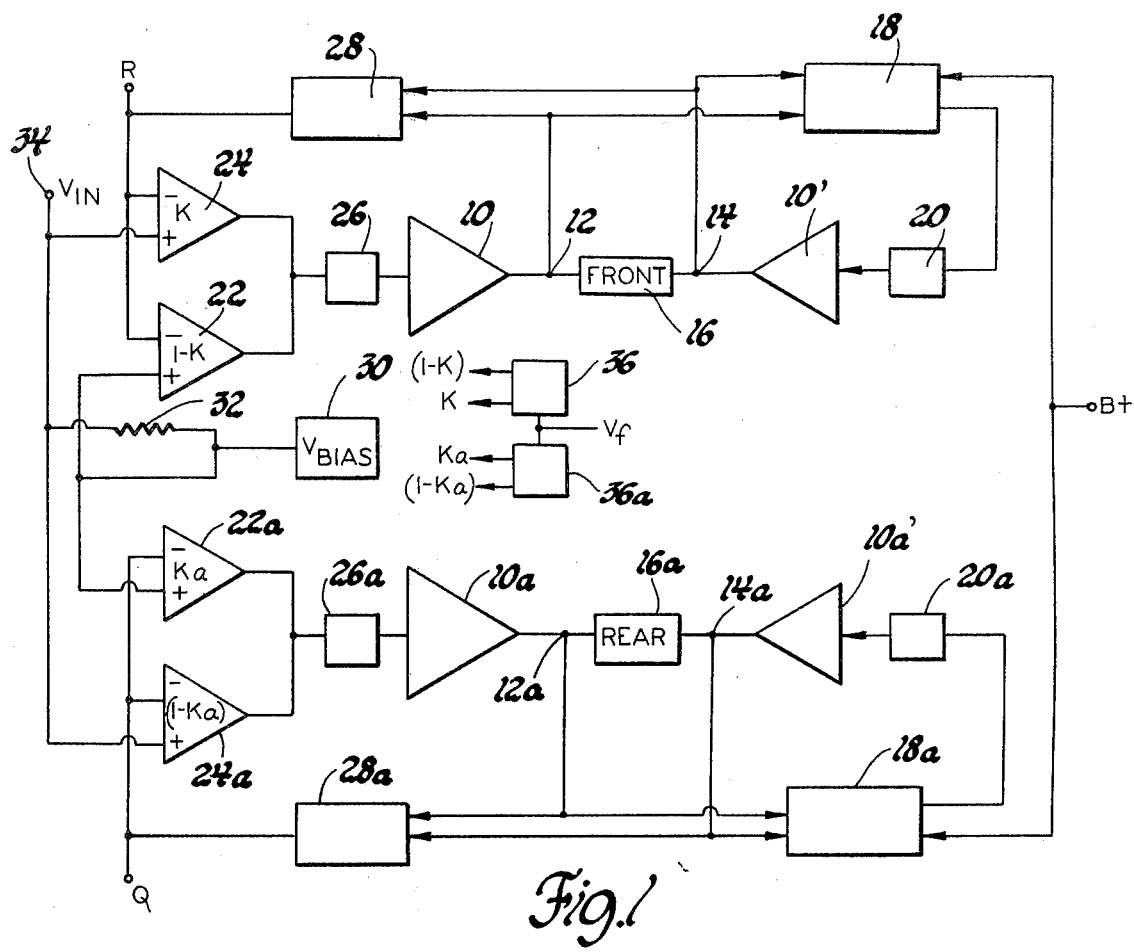
FIG. 1 is a block diagram of the audio amplifier of the present invention.

Referring now to the drawings and initially to FIG. 1, the audio amplifier of the present invention comprises an output stage connected in a bridge configuration and including a master section 10 and a slave section 10' which provide respective inverting and noninverting output signals at load terminals 12 and 14. The terminals 12 and 14 are connected with a load device such as a front speaker 16. A feedback network 18 responds to the supply voltage designated B+ and the output voltages at the terminals 12 and 14 to provide a control current which is converted to a proportional voltage by voltage gain stage 20 and applied to the slave section 10' which maintains the sum of the voltages at the output terminals 12 and 14 equal to B+. The input stage of the bridge audio amplifier comprises a pair of differential transconductance amplifiers 22 and 24. Each of the amplifiers 22 and 24 have inverting and noninverting inputs and single ended outputs which are tied together. The combined output current of the amplifiers 22 and 24 are converted to a porportional voltage by a voltage gain stage 26 and applied to the master section 10. The output terminals 12 and 14 are connected to the inverting inputs of the amplifiers 22 and 24 through a feedback network 28 which maintains the output terminals 12 and 14 at a voltage proportional to the input voltage applied to the noninverting input of amplifier 24. A bias network 30 is connected directly to the non-inverting input of amplifier 22 and through resistor 32 to the noninverting input of amplifier 24 and supplies equal dc bias voltages thereto. Equal dc bias voltage is maintained at the output terminals 12 and 14 through the feedback connection at 28 as will be more apparent hereinafter. The combined effects of the two networks 18 and 28 is to maintain the dc voltage at the output terminals 12,14 at one-half the supply voltage. A second bridge audio amplifier includes components designated by the subscripts "a" and provides inverting and noninverting output signals at terminals 12a,14a connected to a rear speaker 16a.

The audio input signal is applied to the noninverting inputs of the amplifiers 24,24a from input pin 34. A first voltage controlled current source 36 steers complementary percentages (K,1-K) of a constant current source to the amplifiers 24 and 22, respectively as a function of a dc control voltage $V_f$. A second voltage controlled current source 36a steers complementary percentages (Ka,1-Ka) of a second constant current source to the amplifiers 22a and 24a respectively as a function of the voltage $V_f$. By varying the control voltage $V_f$ above or below a reference value, the relative transcondutance of the amplifiers 22,24 or 22a,24a, respectively, may be varied such that the output voltage to the speakers 16 and 16a is selectively reduced from full audio output at the reference voltage to near zero audio output at the extremes above and below the reference voltage to accomplish an audio fade function.

Figure 2:
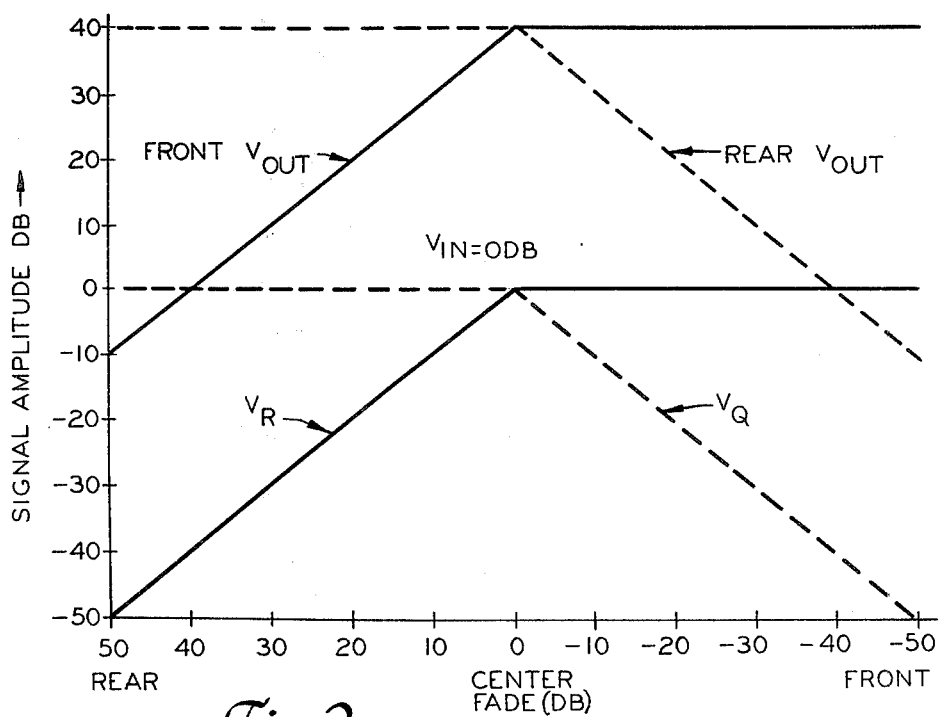
FIG. 2 is a plot of the amplitudes of various signals in the audio amplifier for varying fade conditions.

Referring now to FIG. 2, a plot is shown of the amplitudes of the signals at junctions R and Q of FIG. 1 and across the front and rear speakers 16 and 16a for varying fade conditions. The plots are of the ac (audio) component only and do not include the dc bias at the input and output stages.

For all fade conditions, the input signal is constant and is the reference (0 db) for all other signals described. Since the amplitudes of the signals and the fade conditions are referenced in db, the absolute magnitude of the input is irrelevant as long as the audio amplifier remains linear. It can be seen from the plot that the front and rear output signals are always 40 db greater than the signals at junctions R and Q, respectively. It can also be seen that the signal across the input amplifiers 24 ($V_{IN}$-$V_R$) or 24a ($V_{IN}$-$V_Q$) is directly proportional to the fade. At the center fade position where $V_f$ is the reference voltage, there is essentially no signal across either input amplifier. In other words, the signals at junctions R or Q are essentially identical to the input signal. As the front or rear output is faded, a difference voltage is developed across the associated input amplifier and the amplitude of the difference voltage is equivalent to the number of db of fade.

Figure 3A:
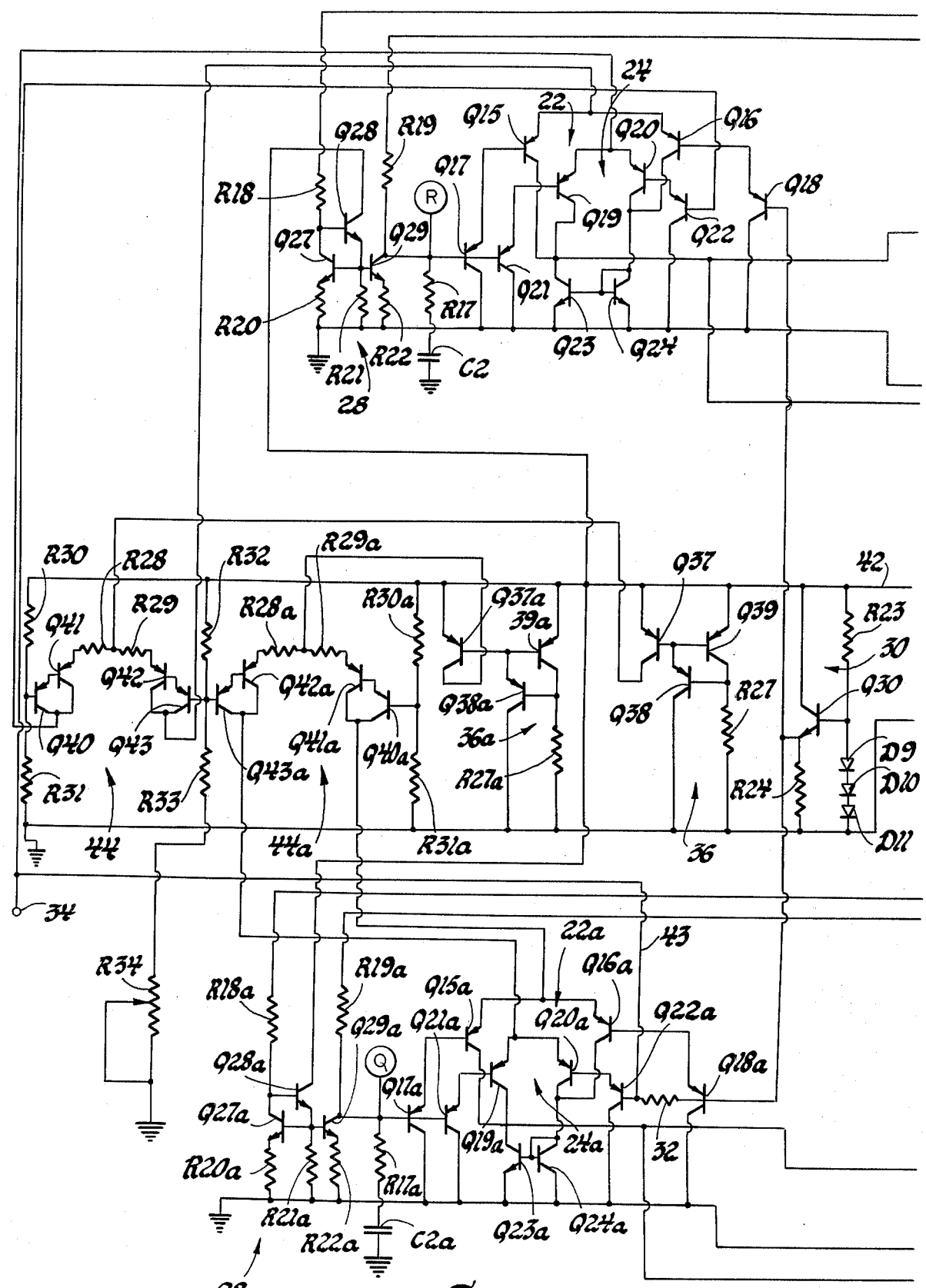
FIGS. 3A and 3B are a detail schematic diagram of the audio amplifier of the present invention as implemented in integrated circuit form.
Figure 3B:
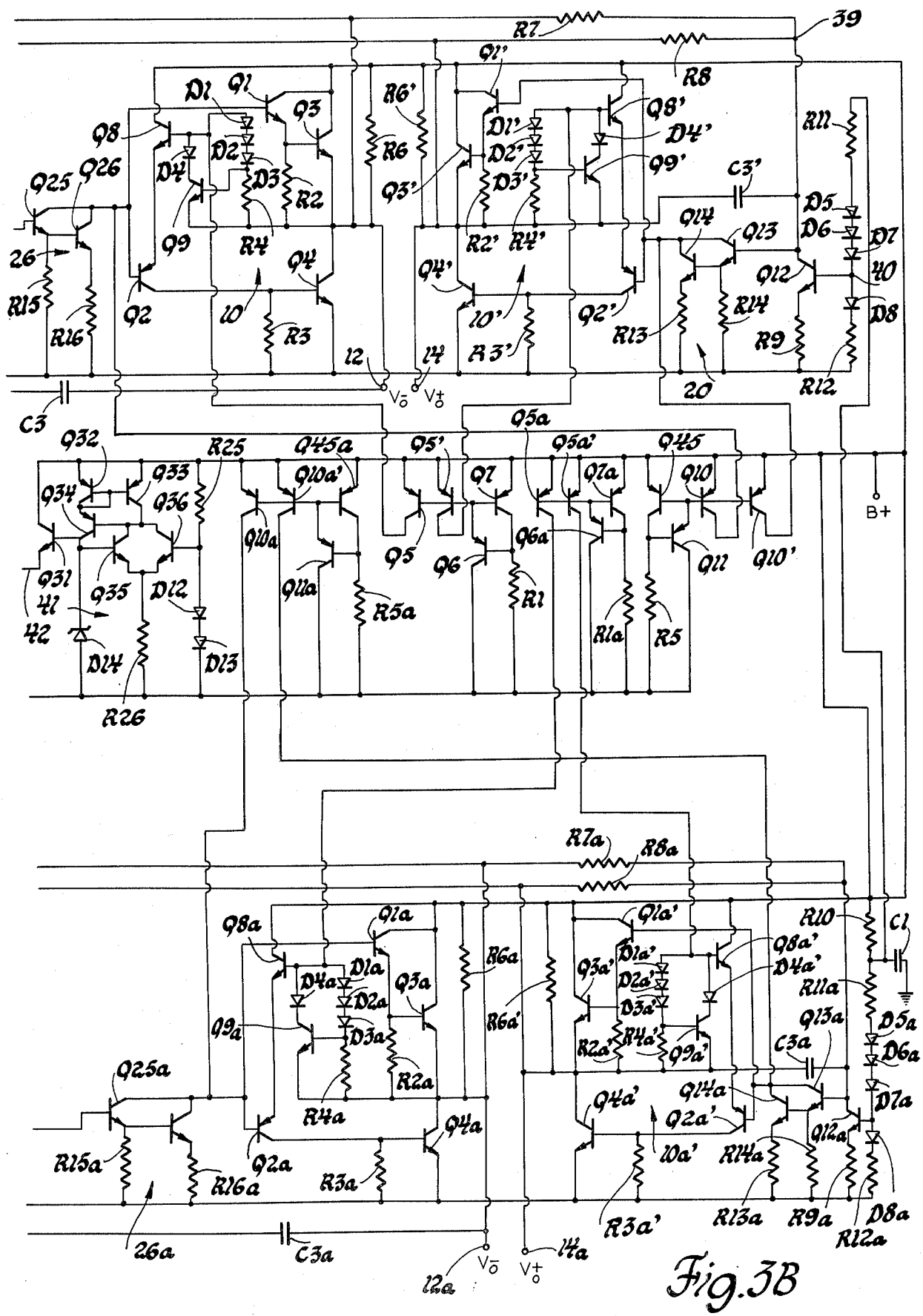

Referring now to FIGS. 3A and 3B, a detail schematic diagram of the present invention in integrated circuit form is shown. The master section 10 comprises transistors Q1 and Q2 which drive output transistors Q3 and Q4. The drive transistors Q1 and Q2 and the power transistors Q3 and Q4 are connected in a push-pull fashion and provide a single ended output at 12. A transistor Q5 is connected with transistors Q6 and Q7 and resistor R1 and provides a constant current to the base of a transistor Q8. The quiescent dc current through Q3 and Q4 is established by area ratioing the emitter-base diodes of Q8, Q2, Q1 and Q3 and the parallel connected diode stack comprising diodes D1, D2, D3 and transistor Q9. The resistors R2, R3 and R4 permit the quiescent current to be adjusted to the desired value. A diode D4 prevents any reverse bias on the collector base diode of Q9. A transistor Q10 is connected with transistors Q11 and Q45 and resistor R5 to form a constant current source. The collector of Q10 is connected to the bases of Q1 and Q2 to provide drive current to the master section 10. A pull-up resistor R6 prevents a latch condition of the output terminal 12 in the event of a short circuit to ground. The slave section 10' is identical to the master section 10 and corresponding components are designated by prime numbers. The terminals 12 and 14 are connected to a summing junction 39 in the network 18 through respective resistors R7 and R8. The junction 39 is connected with the collector of a transistor Q12 whose emitter is connected to ground through a resistor R9. A series network comprising resistors R10–R12 and diodes D5–D8 is connected between B+ and ground and a junction 40 thereof is connected with the base of Q12. This network establishes a current through diode D8 which is dependent upon the supply voltage B+. A capacitor C1 provides ripple rejection on the B+ line. The collector current of Q12 is converted to a voltage by the converter 20 comprising transistors Q13,Q14 and resistors R13,R14. The collector current of Q12 is fixed by the current through diode D8 and the collector voltage of Q12 is fixed by the emitter-base potentials of Q13 and Q14 and the drop across R13. Thus an increase in voltage at terminal 12 will cause an increase in current to the base of Q13 and a decrease in the voltage at the collector of Q14. Conversely, a decrease in voltage at the terminal 12 will cause a decrease in the current to the base of Q13 and an increase in the voltage at the collector of Q14. The voltage at terminal 14 follows the voltage at the collector of Q14. Thus, the sections 10 and 10' operate in a master/slave relationship. The values of the resistors R7,R8 and R10–R12 are selected such that the value of resistor R7 equals the values of resistor R8 and also equals the sum of the values of resistors R10–R12. It follows that the voltage at terminal 12 plus the voltage at terminal 14 will equal the supply voltage B+. Corresponding components of the master section 10a and slave section 10a' of the output stage driving the rear speaker 16a are designated by the subscript "a" and the prime notation where appropriate.

The amplifier 22 comprises transistors Q15, Q16, Q17 and Q18. The amplifier 24 comprises transistors Q19, Q20, Q21 and Q22. The output of a current mirror comprising transistors Q23 and Q24 is connected with the collectors of Q15 and Q19. The diode connected transistor Q24 is connected in the base-emitter circuit of Q23 and maintains the collector current of Q23 equal to the combined collector currents of Q16 and Q20. Any imbalance in the combined collector currents of Q15,Q19 and Q16,Q20 provide a control current to the current-to-voltage conversion stage 26 comprising transistors Q25,Q26 and resistors R15,R16. The feedback network 28 comprises transistors Q27–Q29 and resistors R17–R22 and C2. The bases of Q17,Q21 are connected to ground through the resistor R17 and the roll-up capacitor C2 which provides an ac ground. The output terminals 12 and 14 are connected with the collectors of Q27 and Q29 through the resistors R18 and R19, respectively. The ratio of the resistors R17 and R19 establish the maximum closed loop gain of the audio amplifier. Corresponding components of the amplifiers 22a,24a, converter 26a and feedback network 28a are designated by the subscripts "a".

Dc bias for the amplifiers 22,22a and 24,24a is supplied from the bias circuit 30 comprising transistor Q30, resistors R23,R24 and diodes D9, D10 and D11. The bias circuit 30 is supplied from the output of a voltage regulator 41 at line 42. The regulator 41 is connected to B+ and comprises transistors Q31–Q36, resistors R25,R26 and diodes D12,D13 and a Zener diode D14. The bias voltage at the emitter of Q30 is supplied directly to the base of Q18 and through resistor 32 and conductor 43 to the base of Q22. The bias voltage at the base of Q18 and Q22 is also present at the base of Q17 and Q21 due to the offsetting emitter-base potentials between the base of Q18 and Q17 and between the base of Q22 and Q21. The collector current of Q27 is established by the resistors R18 and R20 in conjunction with the voltage at output pin 12. The resistors R20 and R22 are of equal value and since the bases of Q27 and Q29 are at equal potentials, their collector currents are equal. By proper sizing of the resistor R19, the voltage at the terminal 14 is dc biased to the same voltage present at the terminal 12. Since the terminals 12 and 14 are dc biased by connection with the network 28 to equal voltages and the sum of the voltages at the teminals 12 and 14 must equal B+ due to the network 18, it follows that the terminals 12 and 14 are dc biased to one-half the supply voltage B+. Likewise the terminals 12a and 14a are dc biased to one-half the supply voltage B+. Capacitors C3,C3a and C3',C3a' provide stability compensation. The capacitors C3,C3a also set the band width of the circuit and are external to the integrated circuit due to their size.

The audio signal to the amplifiers 24 and 24a is applied from the input terminal 34 to the bases of Q22 and Q22a. Current is supplied to the amplifiers 22 and 24 from voltage controlled current source 36 which comprises a constant current source including transistors Q37–Q39 and resistor R27. The collector current of Q37 is supplied to a current splitting network 44 comprising transistors Q40–Q43 and resistors R28 and R29. The collector of Q43 is connected with the common emitters of Q15 and Q16 of amplifier 22 and the collector of Q40 is connected with the common emitters of Q19 and Q20 of amplifier 24. Similarly, the voltage controlled current source 36a comprises a constant current source including transistors Q37a–Q39a and resistor R27a which supplies current to the amplifiers 22a and 24a through the current splitting network 44a comprising transistors Q40a–Q43a and resistors R28a and R29a. The collector current of Q40a is supplied to the amplifier 22a while the collector current of Q43a is supplied to the amplifier 24a. The voltages at the bases of Q40 and Q40a are established by voltage dividing networks comprising resistors R30, R31 and R30a,R-31a, respectively. The voltage at the bases of Q43 and Q43a is established from the regulated line 42 by resistors R32 and R33 and potentiometer R34 and is dependent on the setting of the potentiometer R34. Other suitable variable voltage sources may be used if desired. At any particular setting at the potentiometer R34, complementary percentages of the collector current of Q37 are applied to the amplifiers 22 and 24 and complementary percentages of the collector current from Q37a are supplied to the amplifiers 22a and 24a.

The voltages established at the bases of Q40 and Q40a are offset. For example, the voltage at the base of Q40 may be approximately 3.3 volts while the voltage at the base of Q40a may be approximately 4.6 volts. When the potentiometer R34 is in its mid-position, the voltage at the bases of Q43 and Q43a is approximately 4 volts so that the transistors Q40 and Q43a are substantially fully conducting and the transistors Q43 and Q40a are substantially cut-off. Thus, with the potentiometer R34 in its mid-position, substantially all of the current from Q37 is supplied to the amplifier 24, while substantially all of the current from Q37a is supplied to the amplifier 24a. Other values of voltage may be established at the bases of Q40 and Q40a if a different fade characteristic, from that shown in FIG. 2, is desired. As the resistance of the potentiometer R34 is decreased, the voltage at the bases of Q43 and Q43a decreases, causing an increase in the amount of current supplied to the amplifier 22 and a corresponding decrease in the amount of current supplied to the amplifier 24. Since Q43a is already fully conducting, a decrease in the resistance of the potentiometer R34 has no effect on the currents supplied to amplifiers 22a and 24a. If instead the potentiometer R34 is moved from its mid-position to a position of increasing resistance, the voltage at the bases of Q43 and Q43a will rise reducing the current supplied to the amplifier 24a and increasing the current supplied to the amplifier 22a while having no effect on the current supplied to the amplifiers 22 and 24. By lowering the current to the amplifier 24 and increasing the current to the amplifier 22, the ac component of the current to the base of Q25 may be varied without effecting the dc component of this current. As the amplitude of the ac current drive to Q25 is reduced, the amplitude of the voltage signal at the collector of Q26 and also the output terminal 12 are reduced and the power output to the front speaker 16 is reduced without effecting the power to the rear speaker 16a. In other words, a greater differential voltage between the input terminal 34 and the junction R is permitted as the current to the amplifier 24 is reduced. For example, with reference to FIG. 2, when substantially all of the current is supplied to the amplifier 24, the output voltage to the front speaker 16 is 40 db above the voltage provided at the input terminal 34, whereas, when substantially all the current is supplied to the amplifier 22, the output voltage to the front speaker 16 is 10 db below the input voltage at the pin 34.

The embodiments of the invention in which an exclusive property or privilege is claimed are defined as follows:

1. An audio amplifier comprising an input stage, an output stage providing inverting and non-inverting outputs for connection with a load, said input stage comprising a bias amplifier and a signal amplifier each having first and second inputs, means applying equal dc bias voltages to said bias and signal amplifiers, means for applying an audio signal to said first input of said signal amplifier, means for converting the combined output current of said bias and signal amplifiers to a voltage signal and for applying said voltage signal to said output stage, feedback means interconnecting said inverting and non-inverting outputs with said second inputs of said bias and signal amplifiers for establishing the maximum closed loop gain of the amplifier, and means responsive to a variable dc control voltage for reciprocably varying the transconductance of said bias and signal amplifiers to vary the ac gain of said input stage.

2. An audio amplifier comprising an output stage providing inverting and non-inverting outputs for connection with a load,
   an input stage comprising first and second transconductance amplifiers, each having first and second inputs and a single ended output,
   means connected with said single ended output for converting the combined output current of said first and second amplifiers to a voltage signal and for applying said voltage signal to said output stage,
   means for applying equal dc bias voltage to said first inputs of each of said first and second amplifiers,
   means for applying an audio signal to said first input of said first amplifier,
   feedback means interconnecting said inverting and non-inverting outputs of said output stage and said second input of each of said first and second amplifiers for establishing the maximum closed loop gain of the audio amplifier,
   means responsive to a dc control voltage for reciprocably varying the transconductance of said first and second amplifiers for varying the gain of said audio amplifier between said maximum gain and a minimum gain.

3. An audio amplifier comprising an output stage providing inverting and non-inverting outputs for connection with a load,
   an input stage comprising first and second transconductance amplifiers, each having first and second inputs, means for applying an audio input signal to said first input of said first amplifier, said input stage providing an output current including a substantially constant dc component and an ac component which is a function of said input signal and the relative transconductance of said first and second transconductance amplifiers,
   means for converting the output current of said input stage to a voltage signal and for applying said voltage signal to said output stage,
   means for applying a dc bias to said first inputs of each of said first and second amplifiers, feedback means interconnecting said inverting and noninverting outputs with said second input of each of said first and second amplifiers for establishing the maximum closed loop gain of the audio amplifier, means responsive to a dc control voltage for reciprocably varying the transconductance of said first and second amplifiers for varying the ac component of said output current and thereby varying the gain of said audio amplifier.

4. An audio amplifying system including a low level fade control comprising:

first and second audio input stages adapted to be supplied with an audio input signal, said first input stage including first and second transconductance amplifiers providing an output current including an ac component which is a function of said input signal and the relative transconductance of said first and second transconductance amplifiers, said second input stage including third and fourth transconductance amplifiers providing an output current containing an ac component which is a function of said input signal and the relative transconductance of said third and fourth transconductance amplifiers, gain control means responsive to a dc control voltage for selectively varying the gain of the ac component of the output current of said first or second input stages by reciprocably varying the transconductance of said first and second transconductance amplifiers as said control voltage is decreased from a reference level to a predetermined lower voltage level and by reciprocably varying the transconductance of said third and fourth transconductance amplifiers as said control voltage is increased from said reference level to a predetermined upper voltage level, first and second current-to-voltage converter means responsive to the output currents of said first and second input stages respectively, first and second output stages responsive to the output of said first and second converter means respectively, means providing a feedback connection between respective input and output stages for establishing a maximum closed loop gain.

5. The system defined in claim 4 wherein said gain control means comprises first and second current sources, a first current splitting network responsive to the differential between a first fixed voltage and a voltage dependent on said dc control voltage and supplying substantially all of the current from said first current source to said first transconductance amplifier when said dc control voltages is at said reference level and supplying substantially all of the current from said first current source to said second transconductance amplifier when said dc control voltage is at said lower voltage level, a second current splitting network responsive to the differential between a second fixed voltage and said voltage dependent on said dc control voltage and supplying substantially all of the current from said second current source to said third transconductance amplifier when said dc control voltage is at said reference level and supplying substantially all of the current from said second current source to said fourth transconductance amplifier when said dc control voltage is at said upper voltage level.

6. An audio amplifying system including a low level fade control comprising:

first and second input stages adapted to be supplied with an audio input signal, first and second current-to-voltage converter means responsive to the outputs of said first and second input stages respectively, first and second output stages responsive to the outputs of said first and second converter means respectively, means providing a feedback connection between said output stages and said input stages to establish the maximum closed loop gain of the system, said first input stage including first and second transconductance amplifiers providing an output current including a substantially constant dc component and an ac component which is a function of said input signal and the relative transconductance of said first and second transconductance amplifiers, said second input stage including third and fourth transconductance amplifiers providing an output current including a substantially constant dc component and an ac component which is a function of said input signal and the relative transconductance of said third and fourth transconductance amplifiers, gain control means responsive to a dc control voltage for selectively controlling the gain of the ac component of the output current of said first and second input stages by reciprocably varying the transconductance of said first and second transconductance amplifiers as said control voltage is decreased from a reference level to a predetermined lower voltage level and by reciprocably varying the transconductance of said third and fourth transconductance amplifiers when said control voltage is increased from said reference level to a predetermined upper voltage level.

* * * * *